United States Patent
Wu et al.

(10) Patent No.: US 7,098,524 B2
(45) Date of Patent: Aug. 29, 2006

(54) ELECTROPLATED WIRE LAYOUT FOR PACKAGE SAWING

(75) Inventors: Kai-Chiang Wu, HsinChu (TW); Shaw-Wei Chen, HsinChu (TW)

(73) Assignee: Global Advanced Packaging Technology H.K. Limited, Kowloon (HK)

( * ) Notice: Subject to any disclaimer, the term of this patent is extended or adjusted under 35 U.S.C. 154(b) by 0 days.

(21) Appl. No.: 10/911,585

(22) Filed: Aug. 5, 2004

(65) Prior Publication Data

US 2006/0027918 A1    Feb. 9, 2006

(51) Int. Cl.
*H01L 23/544* (2006.01)
*H01L 23/48* (2006.01)
*H01L 23/52* (2006.01)

(52) U.S. Cl. ............... 257/620; 257/776; 257/692; 257/773

(58) Field of Classification Search ........... 257/620, 257/690, 773, 776, 786, 692
See application file for complete search history.

(56) References Cited

U.S. PATENT DOCUMENTS 5,648,661 A * 7/1997 Rostoker et al. ............ 257/48
6,730,989 B1 * 5/2004 Reithinger et al. ......... 257/620

\* cited by examiner

*Primary Examiner*—Nitin Parekh
(74) *Attorney, Agent, or Firm*—Rosenberg, Klein & Lee

(57) ABSTRACT

An electroplated wire layout for package sawing comprises a substrate with a plurality of chip arrays disposed thereon. A kerf having two scribe lines is disposed between every two chip arrays. Several solder ball pads corresponding to the chip arrays are disposed on a back surface of the substrate. Each solder ball pad has a solder ball electroplated wire extended into a kerf. There is also a kerf electroplated wire disposed in each kerf and above the scribe lines of the kerf in a zigzag way. The kerf electroplated wire is connected with the solder ball pad electroplated wires to achieve electric connection. By changing the shape of the kerf electroplated wire, the kerf electroplated wire can be easily cut off to enhance the yield and reliability and also lower the cost.

7 Claims, 7 Drawing Sheets

ELECTROPLATED WIRE LAYOUT FOR PACKAGE SAWING

FIELD OF THE INVENTION

The present invention relates to a package structure and, more particularly, to an electroplated wire layout for package sawing.

BACKGROUND OF THE INVENTION

In order to lower the cost, many products like chip-array ball grid array (CA BGA) adopt a matrix form in their basic designs. Conventionally, a matrix substrate must adopt a common-electrode type electroplated wires. As shown in FIG. 1, electroplated wires 14 are pulled to a common electrode 15 from gold fingers 12 on the front surface of a matrix substrate 10 so that electroplating can be proceeded for the gold fingers 12. Limited by the manufacturing capability of substrate, however, it is necessary to take into account the distance from a solder mask opening 17 to a package edge 16. Because a distance 13 of at least 150μm from the gold fingers 12 to the package edge 16 is required, the flexibility of substrate layout is limited. Moreover, a distance $L_1$ from the gold fingers 12 to a chip 18 needs to shrink therewith. If this distance $L_1$ is close to a minimum value of 450 μm for wire bonding, the yield of wire bonding will be reduced.

In order to solve the above space problem in substrate layout, as shown in FIG. 2, the distance from the solder mask opening 17 to the package edge 16 isn't taken into account. Although a solder resist distance 19 shown in FIG. 1 can be saved in this method, invasion of moisture may occur to reduce the reliability of product.

In order to solve the above problem, another process with no electroplated wire has been derived. As shown in FIG. 3, electroplating can be performed to the gold fingers 12 without pulling the electroplated wires 14 from the gold fingers 12. Therefore, the distance from the gold fingers 12 to the package edge 16 only needs to consider the alignment tolerance and a distance from the solder mask opening 17 to the gold fingers 12. The flexibility in design thus increases much. Although the reliability can be enhanced without extending the electroplated wires 14 to the package edge 16, however, the cost of a matrix substrate with no electroplated wire is high.

Accordingly, the present invention aims to provide an electroplated wire layout for package sawing to solve the above problems in the prior art.

SUMMARY OF THE INVENTION

An object of the present invention is to provide an electroplated wire layout for package sawing. The shape of a kerf electroplated wire is changed so that the kerf electroplate wires on the front surface and the back surface of a substrate can be cut off even when the problem of skewed dicing occurs for package sawing, hence avoiding electric short circuit. Moreover, through this design, whether the kerf electroplated wire has been cut off can be conveniently observed when the kerf electroplated wire is disposed on the back surface of the substrate.

Another object of the present invention is to provide an electroplated wire layout for package sawing to enhance the yield and reliability and also lower the cost without reducing the distance from a solder mask opening to a package edge and without adopting the process using a substrate having no electroplated wire.

To achieve the above objects, the present invention proposes an electroplated wire layout for package sawing, which comprises a substrate with a plurality of chip arrays disposed thereon. A kerf having two scribe lines is disposed between every two chip arrays. Several solder ball pads corresponding to the chip arrays are disposed on a back surface of the substrate. Each solder ball pad has a solder ball electroplated wire extended into the kerf. There is also a kerf electroplated wire disposed in the kerf and above the scribe lines of the kerf in a zigzag way. The kerf electroplated wire is connected with the solder ball pad electroplated wires to achieve electric connection.

The various objects and advantages of the present invention will be more readily understood from the following detailed description when read in conjunction with the appended drawings, in which:

DETAILED DESCRIPTION OF THE PREFERRED EMBODIMENTS

Figure 1:
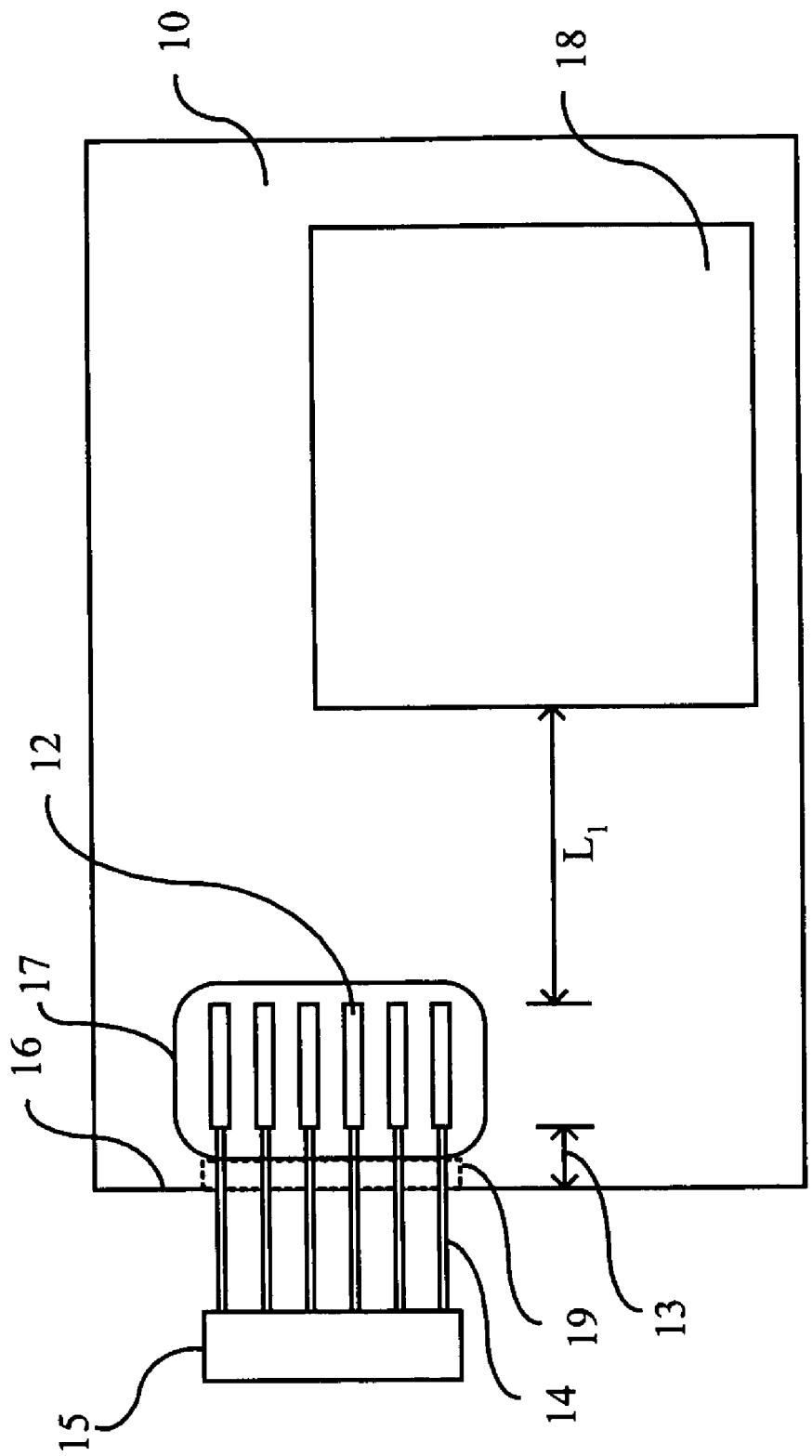
FIG. 1 is a front view of a matrix substrate adopting an electroplated wire layout for package sawing in the prior art.
Figure 2:
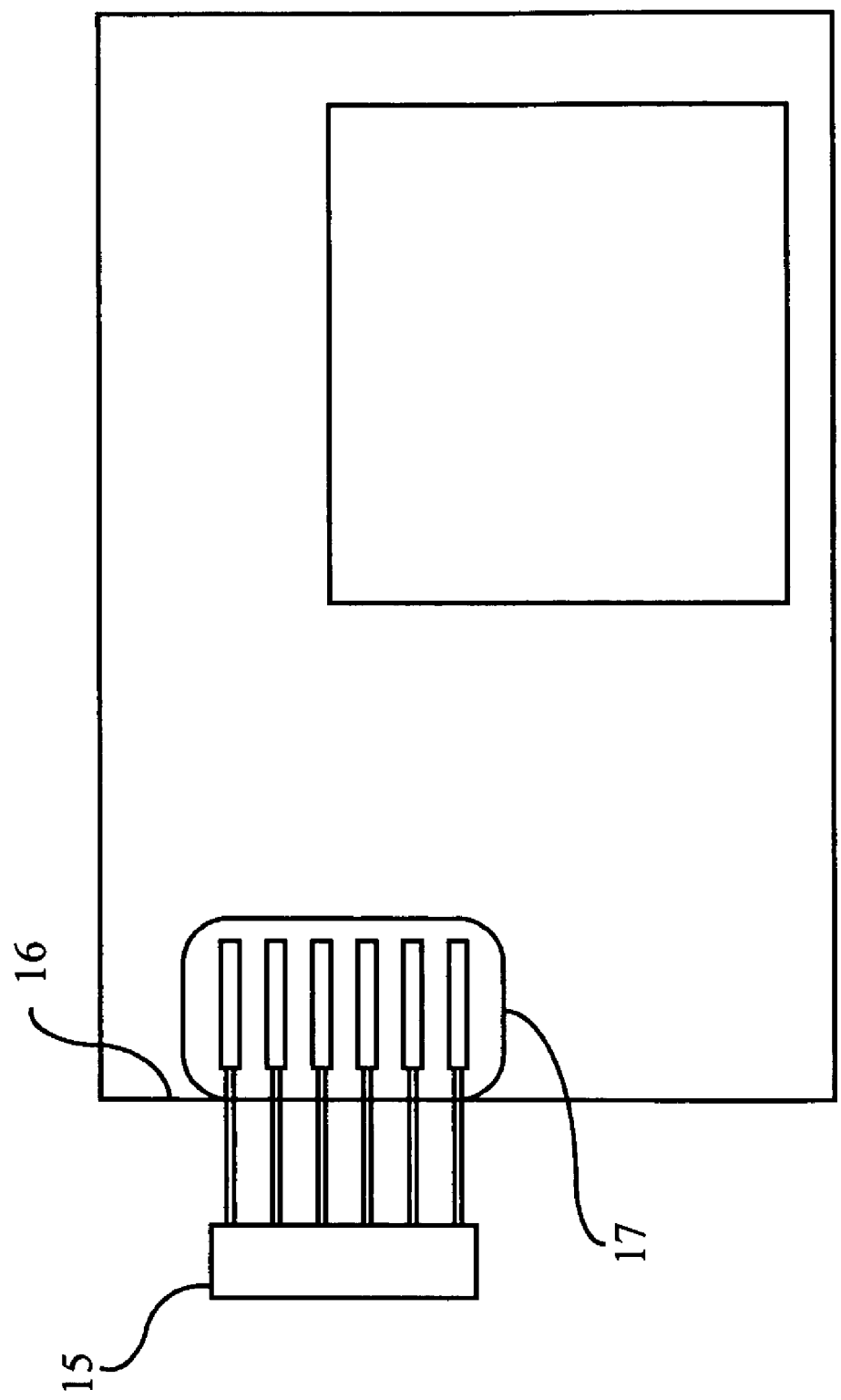
FIG. 2 is another front view of a matrix substrate adopting an electroplated wire layout for package sawing in the prior art.
Figure 3:
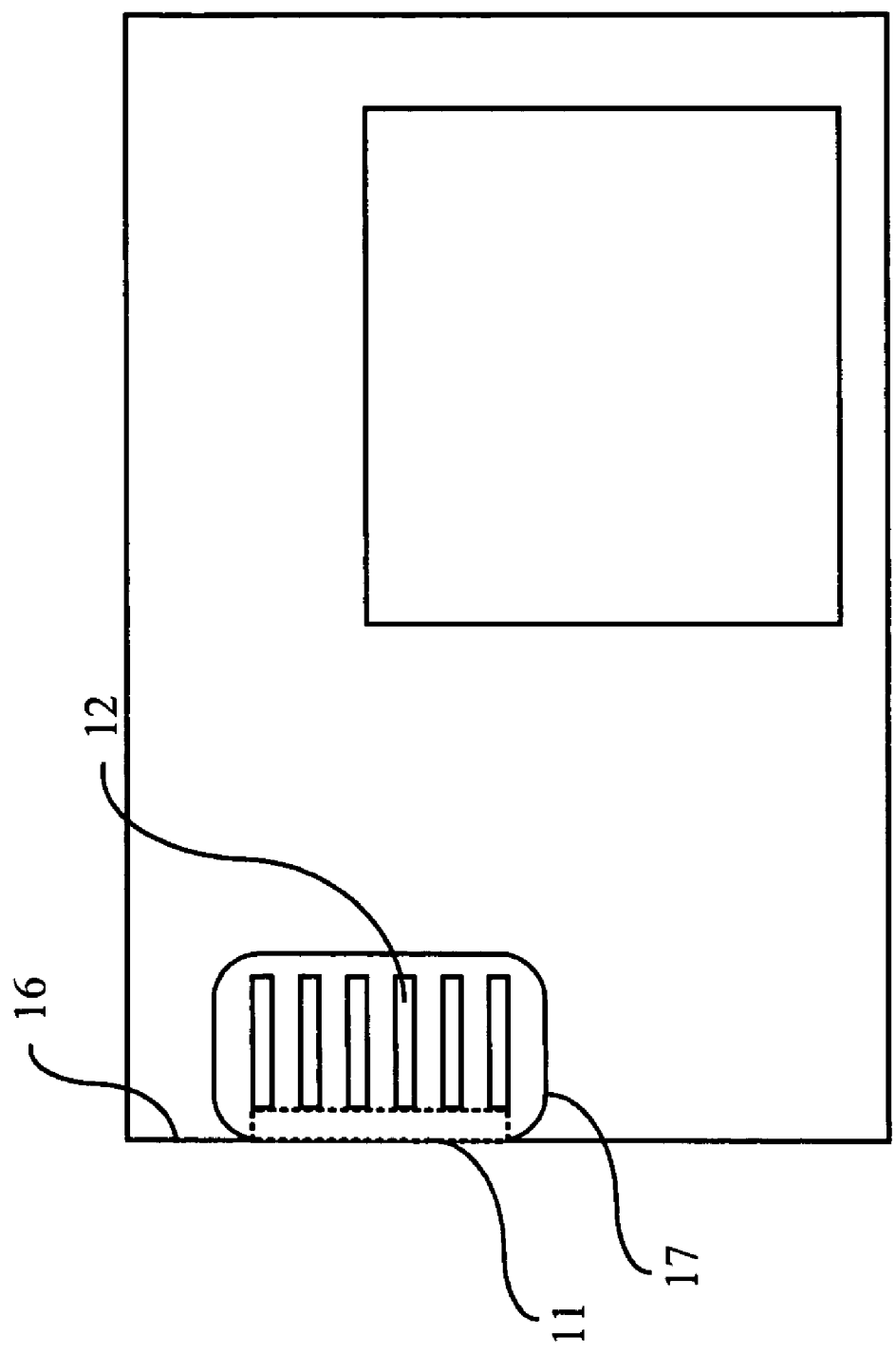
FIG. 3 is a front view of a matrix substrate adopting the process using a substrate having no electroplated wire in the prior art.
Figure 4:
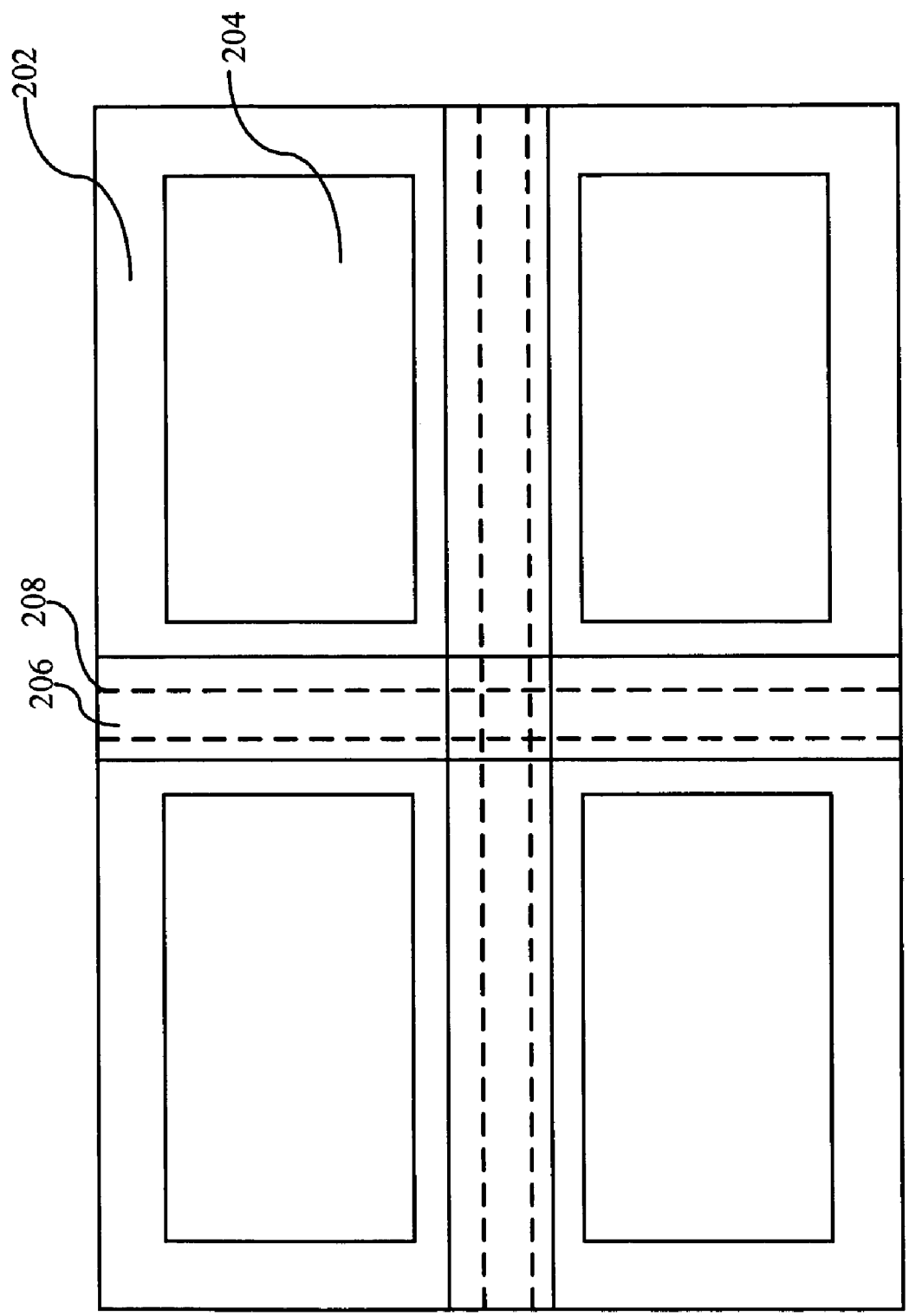
FIG. 4 is a front view of a substrate for package sawing of the present invention.
Figure 5:
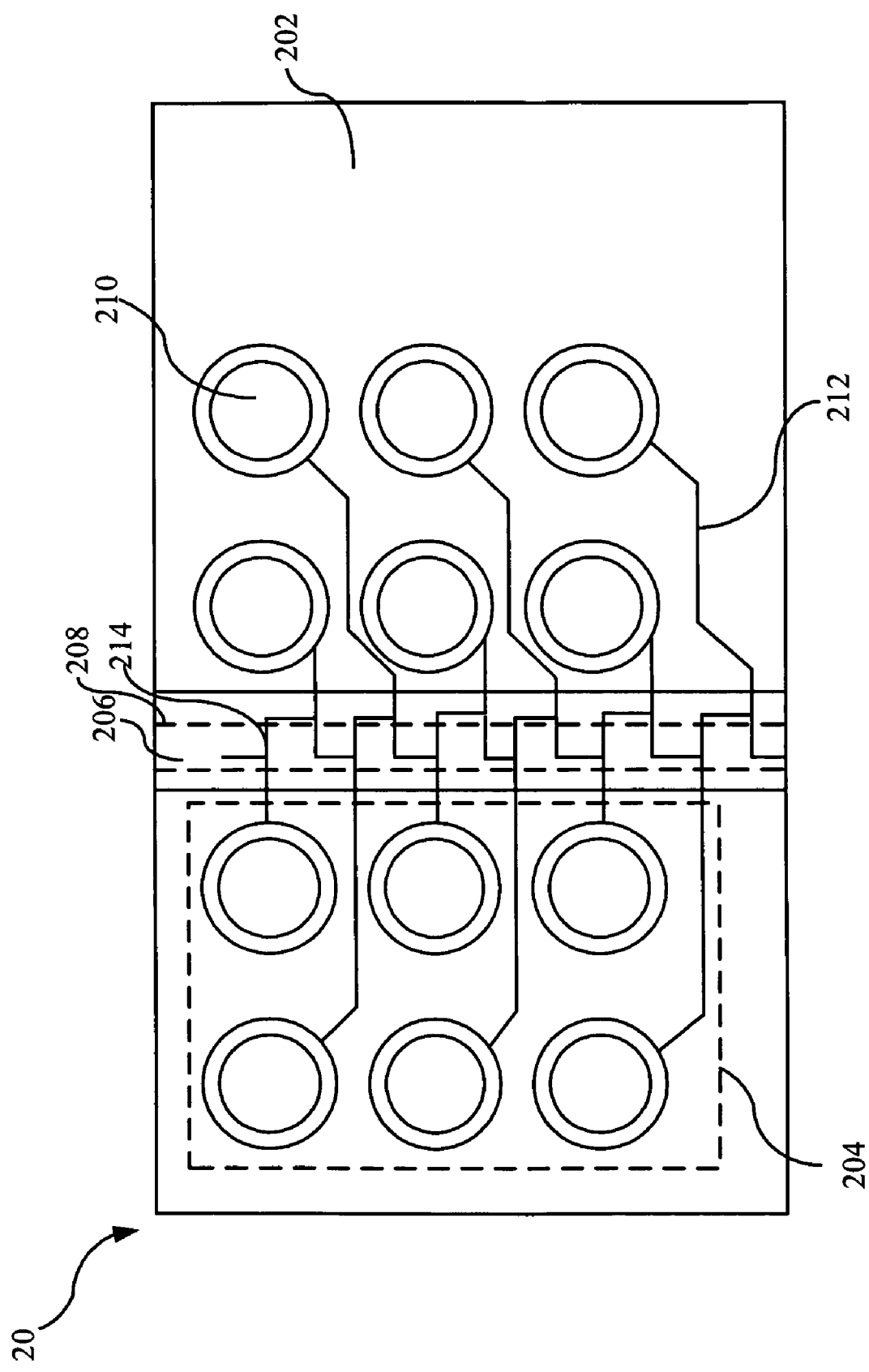
FIG. 5 is a back view of a substrate for package sawing of the present invention.

The present invention proposes an electroplated wire layout for package sawing applicable to a substrate adopting the design of a matrix shape like chip-array ball grid array (CA BGA) products. Under the premise of lowering the cost, the wiring way of a kerf electroplated wire is changed so that the electroplated wire can be easily cut off for package sawing. As shown in FIGS. 4 and 5, a package structure 20 comprises a substrate 202 with a plurality of chip arrays 204 disposed thereon. A kerf 206 is disposed between every two of the chip arrays 204. Each kerf 206 is horizontally or vertically arranged between every two of the chip arrays 204. Each kerf 206 has two scribe lines (i.e., actual dicing edges) 208. Several solder ball pads 210 corresponding to the chip arrays 204 are disposed on a back surface of the substrate 202. A solder ball pad electroplated wire 212 is disposed on each solder ball pad 210 and extended into the kerf 206. A kerf electroplated wire 214 is disposed on the kerf 206 and above the scribe lines 208 in a zigzag way. The kerf electroplated wire 214 is connected with the solder ball pad electroplated wires 212 to achieve electric connection.

Figure 6:
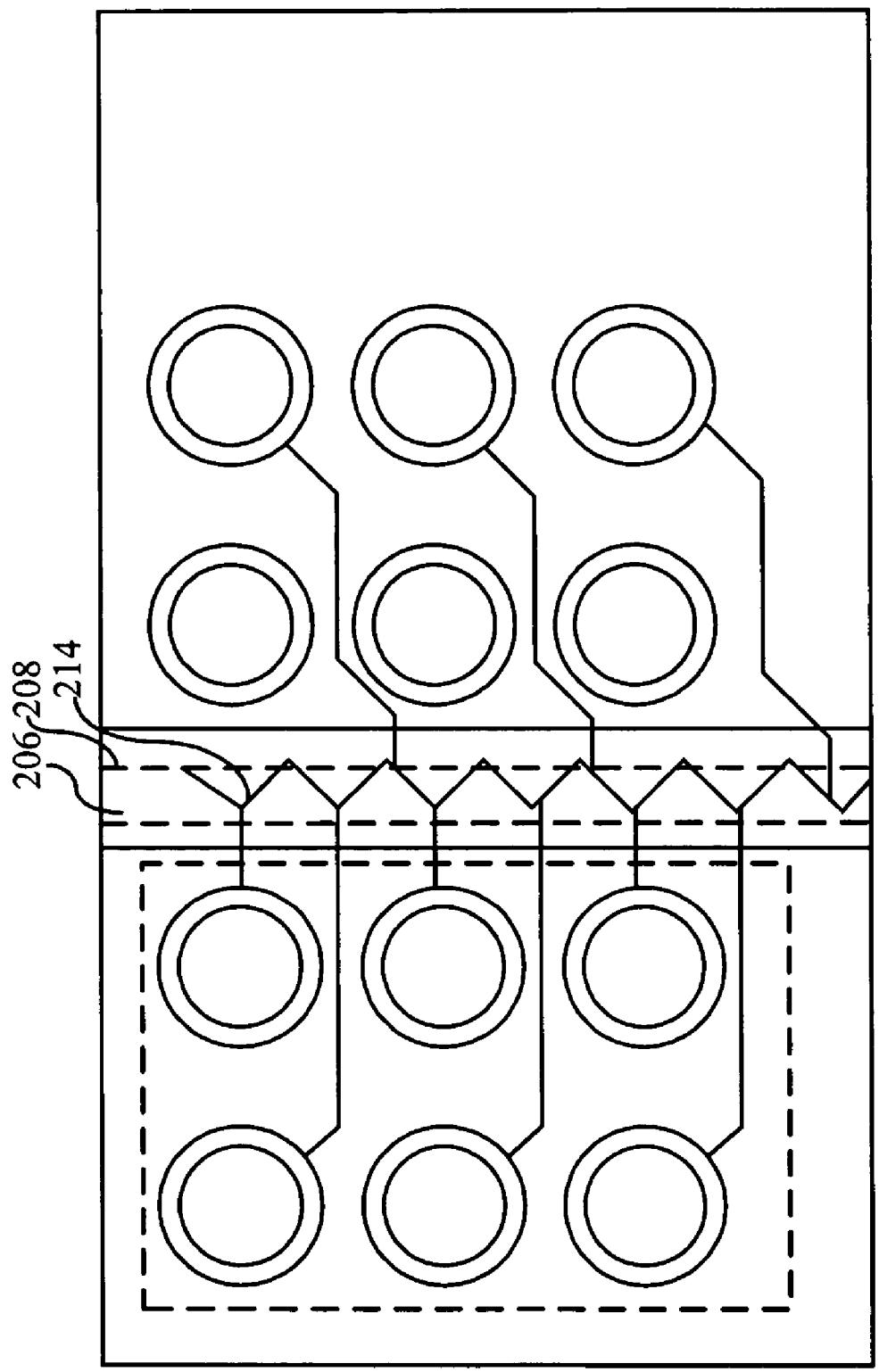
FIG. 6 is a view according to another embodiment of the present invention.
Figure 7:
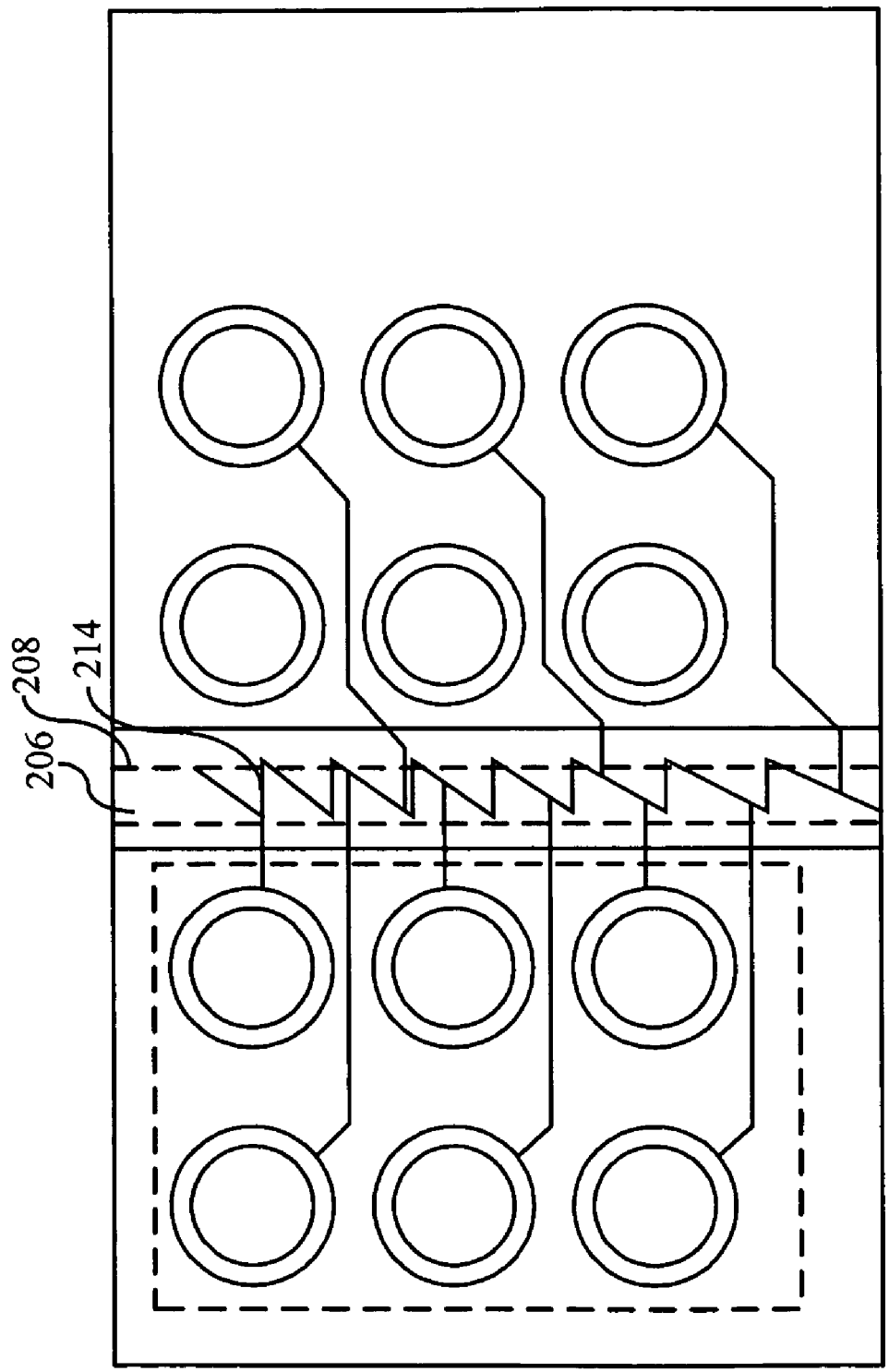
FIG. 7 is a view according to yet another embodiment of the present invention.

The kerf electroplated wire 214 can be of a continuous bow shape shown in FIG. 5, a continuous W shape shown in FIG. 6, or a continuous angle shape shown in FIG. 7, or the kerf electroplated wire 214 can be of a continuous S shape (a non-straight-line shape) to let part of the kerf electroplated wire 214 transversely pass the scribe lines 208. Thereby, when the substrate 202 is sawn along the scribe lines 208, because the kerf electroplated wire 214 passes the scribe lines 208, the kerf electroplated wire 214 will certainly be cut off. Moreover, if there is a too large alignment tolerance between the front surface and the back surface of the substrate 202, the kerf electroplated wire 213 on the front surface of the substrate 202 will also be cut off, hence having no problem of electric short circuit. Contrarily, in the prior art, the wiring of the electroplated wire is straight-line and doesn't necessarily pass the scribe lines 208 so that the problem of uncut electroplated wire may occur if the scribe lines 208 are cut skewedly.

To sum up, the present invention makes use of change of the shape of the kerf electroplated wire so that the kerf electroplated wire can be cut off even when the problem of skewed dicing occurs for package sawing. Through design of the kerf electroplated wire, whether the kerf electroplated wire has been cut off can be easily observed when the kerf electroplated wire is disposed on the back surface of the substrate. Moreover, unlike the prior art, the yield and reliability can be enhanced and the cost can also be lowered without saving the distance from the solder mask opening to the package edge and adopting the process using a substrate having no electroplated wire.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. An electroplated wire layout for package sawing comprising:

a substrate with a plurality of chip arrays disposed thereon, a kerf being disposed between every two of said chip arrays, each said kerf having two scribe lines;

several solder ball pads corresponding to said chip arrays and disposed on a back surface of said substrate;

several solder ball pad electroplated wires, each connected to one of said solder ball pads and extended into said kerf; and at least one kerf electroplated wire having a continuous periodically contoured shape and located only in said kerf, said at least one kerf electroplated wire extending above at least one of said scribe lines in a plurality of crossing points, said kerf electroplated wire being connected with said solder ball pad electroplated wires in said kerf to achieve an electric connection therebetween.

2. The electroplated wire layout for package sawing as claimed in claim 1, wherein said at least one kerf electroplated wire is formed in an S shape.

3. The electroplated wire layout for package sawing as claimed in claim 1, wherein said at least one kerf electroplated wire is formed in a bow shape.

4. The electroplated wire layout for package sawing as claimed in claim 1, wherein said at least one kerf electroplated wire is formed in a W shape.

5. The electroplated wire layout for package sawing as claimed in claim 1, wherein said at least one kerf electroplated wire is formed in a an angle shape.

6. The electroplated wire layout for package sawing as claimed in claim 1, wherein said kerf is horizontally disposed between every two of said chip rays.

7. The electroplated wire layout for package sawing as claimed in claim 1, wherein said kerf is vertically disposed between every two of said chip rays.

* * * * *